US011165461B2

(12) United States Patent
Kwok et al.

(10) Patent No.: US 11,165,461 B2
(45) Date of Patent: Nov. 2, 2021

(54) N-PHASE PASSIVE RECEIVER MIXER

(71) Applicant: QUALCOMM INCORPORATED, San Diego, CA (US)

(72) Inventors: Chi-Fung Kwok, London (GB); Vasileios Mylonakis, Cambridge (GB); Idris El-Fatmaoui, Waterbeach (GB)

(73) Assignee: QUALCOMM Incorporated, San Diego, CA (US)

( * ) Notice: Subject to any disclaimer, the term of this patent is extended or adjusted under 35 U.S.C. 154(b) by 63 days.

(21) Appl. No.: 16/744,757

(22) Filed: Jan. 16, 2020

(65) Prior Publication Data

US 2020/0244303 A1 Jul. 30, 2020

(30) Foreign Application Priority Data

Jan. 25, 2019 (GR) ............................. 20190100046

(51) Int. Cl.
*H04B 1/44* (2006.01)
*H04B 1/401* (2015.01)
*H04B 1/10* (2006.01)

(52) U.S. Cl.
CPC ............. *H04B 1/44* (2013.01); *H04B 1/1081* (2013.01); *H04B 1/401* (2013.01)

(58) Field of Classification Search
CPC ......... H04B 1/1081; H04B 1/44; H04B 1/401
See application file for complete search history.

(56) References Cited

U.S. PATENT DOCUMENTS

2017/0222628 A1* 8/2017 Darvishi ............... H03H 19/002
2020/0274564 A1* 8/2020 Abhishek ............. H04B 1/1036

\* cited by examiner

*Primary Examiner* — Sam Bhattacharya
(74) *Attorney, Agent, or Firm* — Smith Tempel Blaha LLC/Qualcomm (57) ABSTRACT

A system for wireless communication may include a passive gain front end circuit coupled to an N-path filter. In a transmit mode, signals may be provided to an antenna through the passive gain circuit. In the transmit mode, the N-path filter may provide isolation at the antenna. In a receive mode, the passive gain front end may provide gain to the received signal. In the receive mode, the N-path filter may be used to downconvert the received signal.

18 Claims, 8 Drawing Sheets

N-PHASE PASSIVE RECEIVER MIXER

RELATED APPLICATION & PRIORITY CLAIM

This application claims priority to and the benefit of the filing date of Greek Patent Application No. 20190100046, filed Jan. 25, 2019, entitled "N-PHASE PASSIVE RECEIVER MIXER," and the contents thereof are incorporated herein in their entirety by this reference as if fully set forth below and for all applicable purposes.

FIELD

The present disclosure relates to wireless communications, and more particularly, to wireless transceivers having N-phase front end filtering.

BACKGROUND

A traditional wireless transceiver architecture, such as has commonly been employed in cellular telephones, may include a receiver portion in which the signal from the antenna is first bandpass filtered, and the resulting signal amplified by a low-noise amplifier (LNA) before being downconverted by a pair of in-phase (I) and quadrature-phase (Q) mixers to a baseband frequency for further processing. There is a desire to improve performance while maintaining or reducing cost of wireless transceivers.

SUMMARY

Various implementations of systems, methods, and apparatuses within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that relative dimensions of elements depicted in the drawing figures may not be to scale.

One aspect of the disclosure provides a system for wireless communication. The system may include a passive gain front end circuit having an antenna connection. The system may further include a receiver circuit having an N-path filter coupled to the passive gain front end circuit.

Another aspect of the disclosure provides a wireless transceiver system. The system may include a passive gain front end circuit, a receiver circuit, and a transmitter circuit. The passive gain front end circuit may be operable in response to a transmit/receive (TX/RX) mode control signal indicating whether the transceiver system is in a transmit mode or a receive mode. The receiver circuit may include an N-path filter coupled to the passive gain front end circuit. The N-path filter may be operable in response to the TX/RX mode control signal.

Still another aspect of the disclosure provides a method for wireless communication. The method may include receiving a signal from an antenna through a passive gain front end circuit. The method may further include downconverting the received signal from the passive gain front end circuit using N-path filtering in response to a TX/RX mode control signal indicating the receive mode. The method may still further include transmitting a signal through the passive gain front end circuit in response to the TX/RX mode control signal indicating a transmit mode.

Yet another aspect of the disclosure provides an apparatus for wireless communication. The apparatus may include means for receiving a signal from an antenna through a passive gain front end circuit. The apparatus may further include means for downconverting the received signal from the passive gain front end circuit using N-path filtering in response to the TX/RX mode control signal indicating the receive mode. The apparatus may still further include means for transmitting a signal through the passive gain front end circuit in response to the TX/RX mode control signal indicating a transmit mode.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described herein may be performed in an order different from that described, and various steps may be added, omitted, or combined. Also, features described with respect to some examples may be combined in other examples.

Figure 1:
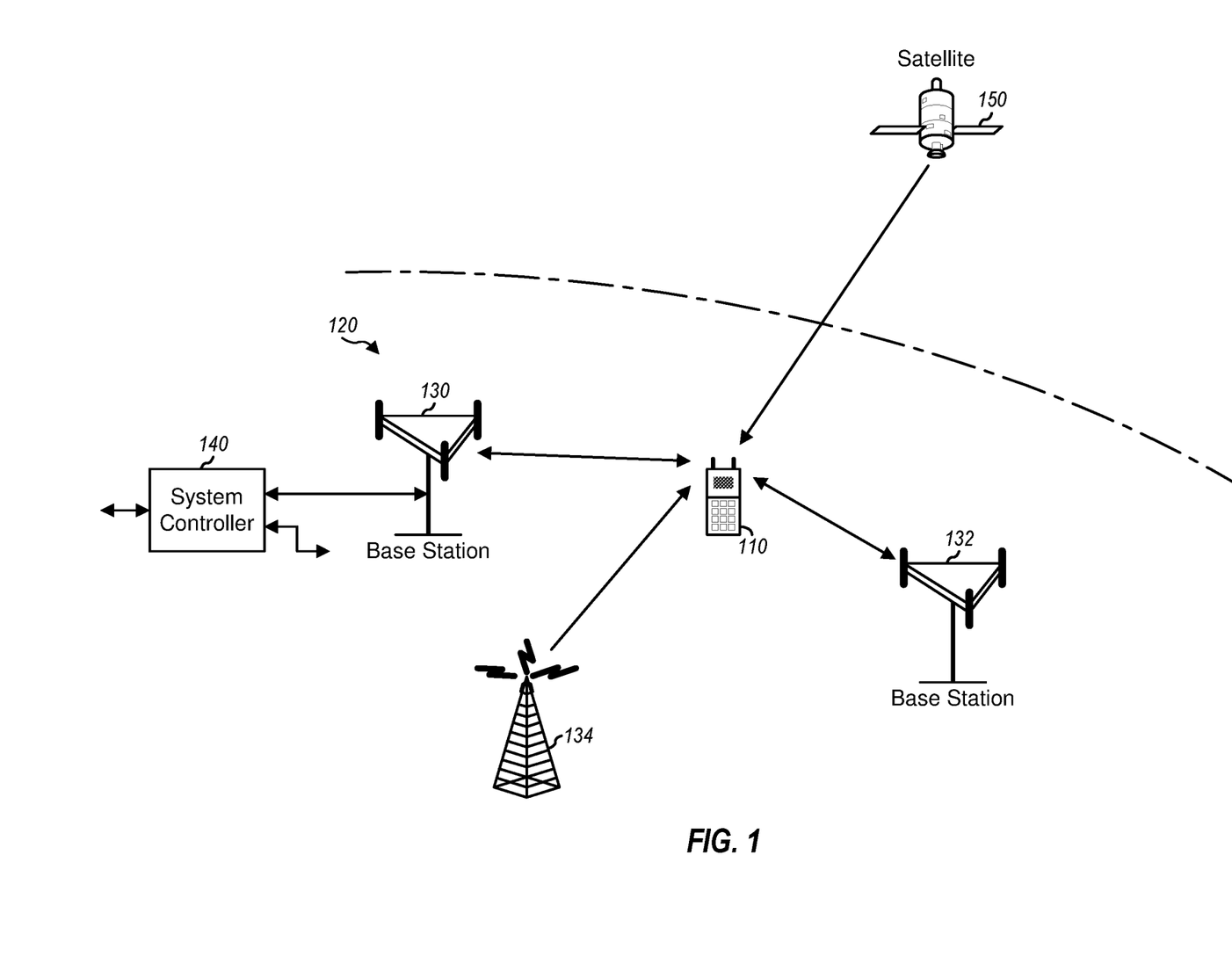
FIG. 1 is a block diagram of an example of a wireless communication system, in accordance with various aspects of the present disclosure.

FIG. 1 is a diagram showing a wireless device 110 in a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. More generally, such a wireless communication system may include any number of such base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate bidirectionally with base stations 130 and 132, with one or more access points, and/or with one or more other wireless or mobile devices. Wireless device 110 may receive signals from broadcast stations (e.g., a broadcast station 134). Wireless device 100 may receive signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, 5G, etc.

Wireless device 110 may support carrier aggregation, for example as described in one or more LTE standards. For example, wireless device 110 may be configured to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. Low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz in some standards and may include one or more carriers. Each carrier may cover up to 20 MHz in LTE, for example. LTE Release 11 supports 35 bands, which are referred to as LTE/UMTS bands and are listed in 3GPP TS 36.101. Wireless device 110 may be configured with up to five carriers in one or two bands in LTE Release 11 in some embodiments.

Increasing desirability for a wireless device to receive multiple bands has led to further development of tunable front end filtering, including a technique commonly referred to as N-phase or N-path filtering. In N-path filtering, some number N of resistive-capacitive (RC) filters are sequentially or cyclically switched. The center frequency of the filter can be selected by selecting the switching frequency. So-called "mixer-first" receivers represent an evolution of N-path filtering. As described below with regard to FIG. 2, in a mixer-first architecture an N-path filter is configured to perform the function of traditional downconverter mixers but is connected to the antenna without an intervening low-noise amplifier (LNA). Eliminating the LNA provides advantages such as saving power. Nevertheless, a mixer-first receiver without any front end structure may suffer various disadvantages, such as sensitivity to antenna impedance variations (i.e., poor VSWR), poor reverse isolation between the local oscillator and antenna, and poor noise figure.

Figure 2:
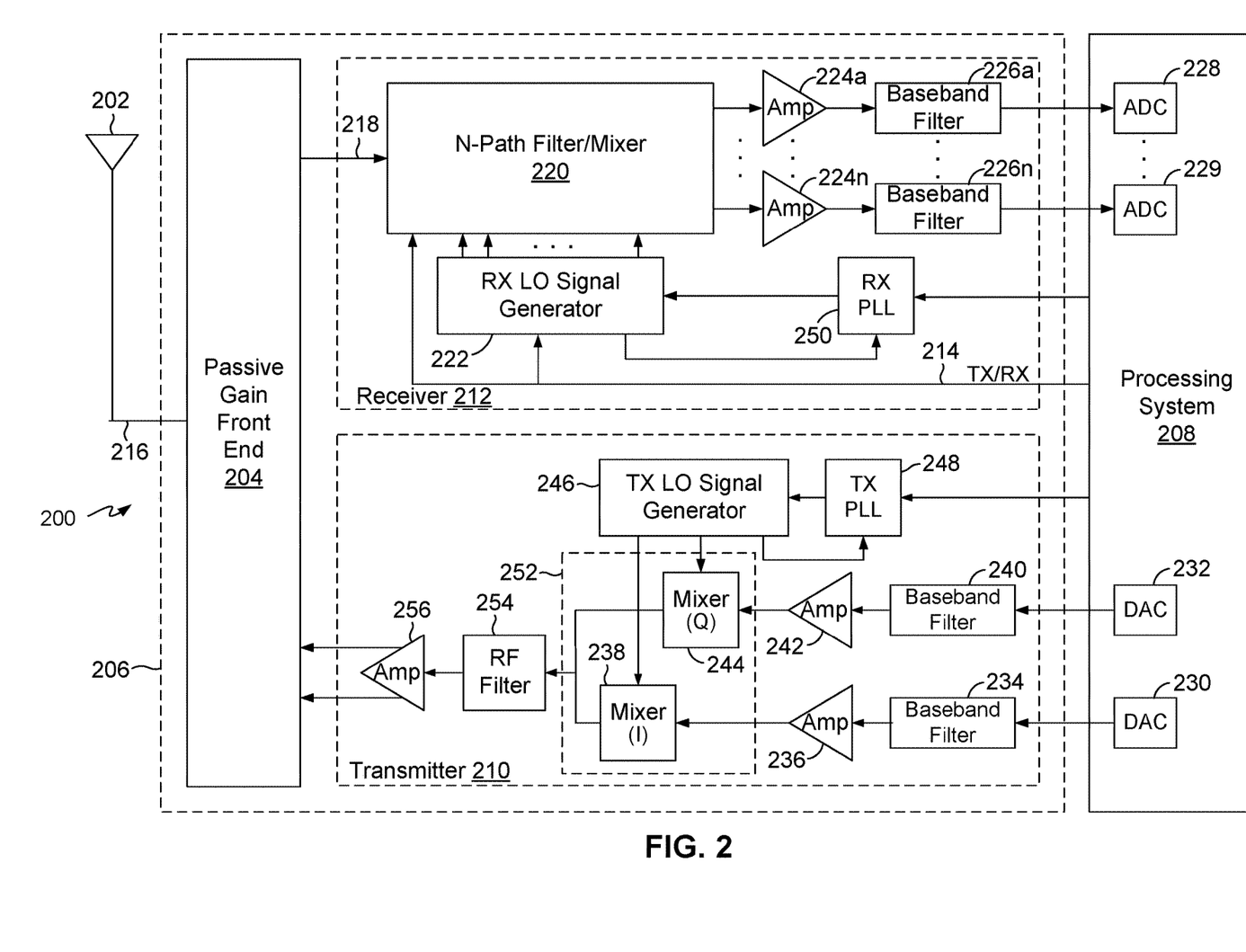
FIG. 2 is a block diagram of a wireless transceiver device of the wireless communication system, in accordance with various aspects of the present disclosure.

FIG. 2 is a block diagram of a wireless device 200 in which the exemplary systems and methods of the present disclosure may be implemented. Wireless device 200 may be an example of above-described wireless device 110 (FIG. 1). For example, in some embodiments wireless device 200 may be a smartphone. In other embodiments, wireless device 200 may be an internet of things (IoT) device, or other device. It is generally desirable for integrated circuit chips used in consumer market IoT devices to be low in power and as economical as possible. Accordingly, in an embodiment in which wireless device 200 is an IoT device, the reduced power consumption may be particularly advantageous, for example due to the omission in an LNA, and savings in chip area and bill of materials (BOM) may further be beneficial and may be implemented in devices that maintain required performance (e.g., with respect to the filtering required for channel selection).

Wireless device 200 may include an antenna 202, a transceiver portion 206, and a processing system 208. Transceiver portion 206 may include a passive gain front end 204, a transmitter portion 210 and a receiver portion 212. Processing system 208 may include analog and digital processing elements, some of which are shown in FIG. 2 and described below. Among elements of processing system 208 that are not shown for purposes of clarity are one or more processors and memories. The processors may control various aspects of the operation of wireless device 200 by executing program code (i.e., software or firmware) stored in the memories. In this manner, processing system 208 may generate various control signals, which may include a transmit/receive (TX/RX) mode control signal 214. The TX/RX mode control signal 214 has at least two states: one indicating operation in a transmit mode, and the other indicating operation in a receive mode. As described below, elements of transmitter portion 210 and receiver portion 212 may be configured to switch states (e.g., on and off) in response to TX/RX mode control signal 214. Although not shown for purposes of clarity, processing system 208 may include user interface-related elements, such as a touchscreen display, microphone, speaker, etc.

An antenna connection 216 of passive gain front end 204 is connected to antenna 202. A received signal connection 218 of receiver portion 212 is connected to an output of passive gain front end 204. A radio frequency (RF) signal received from antenna 202 through passive gain front end 204 may thus be provided to an N-path filter 220 of receiver portion 212. Note that in this mixer-first architecture, there is no LNA in the signal path between antenna 202 and N-path filter 220 (configured as a mixer) as in a conventional receiver architecture. Rather, the input of N-path filter 220 is directly connected to the received signal output of passive gain front end 204.

As described below in further detail, when TX/RX mode control signal 214 indicates the receive mode, passive gain front end 204 is not prevented from providing gain to the signal. Also when TX/RX mode control signal 214 indicates the receive mode, N-path filter 220 functions as a downconversion mixer, using local oscillator (LO) signals provided by an RX local oscillator signal generator 222 to downconvert the received signal, for example to a baseband or intermediate frequency. As understood by one of ordinary skill in the art, the LO signals are provided to the N paths of N-path filter 220 in a sequential or cyclical manner, and characteristics of the signals, such as the pulse width and the frequency at which the signals cycle through the N paths, determine the filter center frequency and other filtration and downconversion effects. The output of N-path filter 220 is in the form of N signal paths, where N is a number greater than or equal to two. Each the N signal path outputs of N-path filter 220 is connected to an input of a respective one of N amplifiers 224a through 224n For purposes of clarity, the remaining amplifiers between the first amplifier 224a and the Nth amplifier 224n are not individually shown but rather are indicated by an ellipsis (" . . . ") symbol. The output of each one of amplifiers 224a through 224n may be connected to an input of a respective one of N baseband filters 226a through 226n. (Baseband filters between the first baseband filter 226a and the Nth baseband filter 226n are similarly not individually shown.) The N amplified and filtered signals are provided to processing system 208. In the exemplary embodiment shown, processing system 208 includes N analog-to-digital-converters (ADCs) 228 through 229 configured to convert the N analog signals into digital signals to be further processed by processing system 208. (ADCs between the first ADC 228 and the Nth ADC 229 are likewise not individually shown.) Nevertheless, in other embodiments a processing system may receive such signals digitally from ADCs included in the receiver portion. In some embodiments, two or more of the signal paths output from the N-path filter 220 are combined prior to being provided to the processing system 208. For example, the signal paths may be combined by a summer or at a summing node (not illustrated) after being filtered by the baseband filters 226a-226n and a combined signal provided to ADC 228 (and, as described above, the ADC 228 or other such ADC may be implemented in the processing system 208 or may be implemented in the receiver portion 212 or otherwise in the transceiver portion 206). In some embodiments, the signal paths are combined between the amplifiers 224a-224n and filtering such that a combined signal is provided to a baseband filter 226. The amplifiers 224a-224n may be implemented separately or together. For example, amplification may be performed in a a single block having N inputs and providing amplification for each of the N signals output from the N-path filter 220. This single block may output N amplified signals to the baseband filters 226a-226n or a combined signal to a baseband filter 226. Similarly, The amplifiers 226a-226n may be implemented separately or together in a single block, and may output N signals or a combined signal.

Also, although the embodiment illustrated in FIG. 2 has only a single receive path comprising N-path filter 220, amplifiers 224a-224n, baseband filters 226a-226n, etc., other embodiments may include multiple receive paths. Such other embodiments may include embodiments in which all receive paths are similar to the receive path of the embodiment illustrated in FIG. 2. Alternatively, such other embodiments may include embodiments in which some of the receive paths are similar to the receive path of the embodiment illustrated in FIG. 2 and other receive paths have conventional architectures, such as architectures that include an LNA.

When TX/RX mode control signal 214 indicates the transmit mode, passive gain front end 204 may not provide passive gain. Also when TX/RX mode control signal 214 indicates the transmit mode, N-path filter 220 reduces loading at antenna 202, as described below in further detail.

Transmitter portion 210 may have a direct-conversion architecture as shown in FIG. 2. Nevertheless, in other embodiments transmitter portion 210 may be implemented with a super-heterodyne or other architecture. In the illustrated embodiment, processing system 208 includes digital-to-analog-converters (DACs) 230 and 232 to convert information to be transmitted into analog format. The information may be provided through a pair of in-phase (I) and quadrature-phase (Q) paths. The I path may include DAC 230 as well as a baseband filter 234, an amplifier 236, and an I mixer 238. The Q path may include DAC 232 as well as a baseband filter 240, an amplifier 242, and Q mixer 244. Although in the illustrated embodiment DACs 230 and 232 are included in processing system 208, in other embodiments such a processing system may provide such signals digitally to DACs included in the transmitter portion.

A TX LO signal generator 246 may generate I and Q TX LO signals used for frequency upconversion. Each TX LO signal is a periodic signal with a particular fundamental frequency. A TX phase-locked loop (PLL) 248 receives timing information from processing system 208 and generates a control signal used to adjust the frequency and/or phase of the TX LO signals from TX LO signal generator 246. Similarly, an RX PLL 250 receives timing information from processing system 208 and generates a control signal used by LO signal generator 222 to adjust the above-described RX LO signals.

Mixers 238 and 244 together define an upconverter 252 that upconverts the I and Q baseband signals using the I and Q transmit (TX) local oscillator (LO) signals provided by TX LO signal generator 246 and provides an upconverted signal. A filter 254 filters the upconverted RF signal to remove undesired images caused by the frequency upconversion as well as noise in a receive frequency band. While the above description includes I and Q signals, the wireless device 200 may additionally or alternately implement signals having a polar representation.

A power amplifier (PA) 256 amplifies the signal provided by filter 254 to obtain the desired output power level and provides a TX RF signal. The TX RF signal is provided to antenna 202 through passive gain front end 204 in a manner described below.

Figure 3:
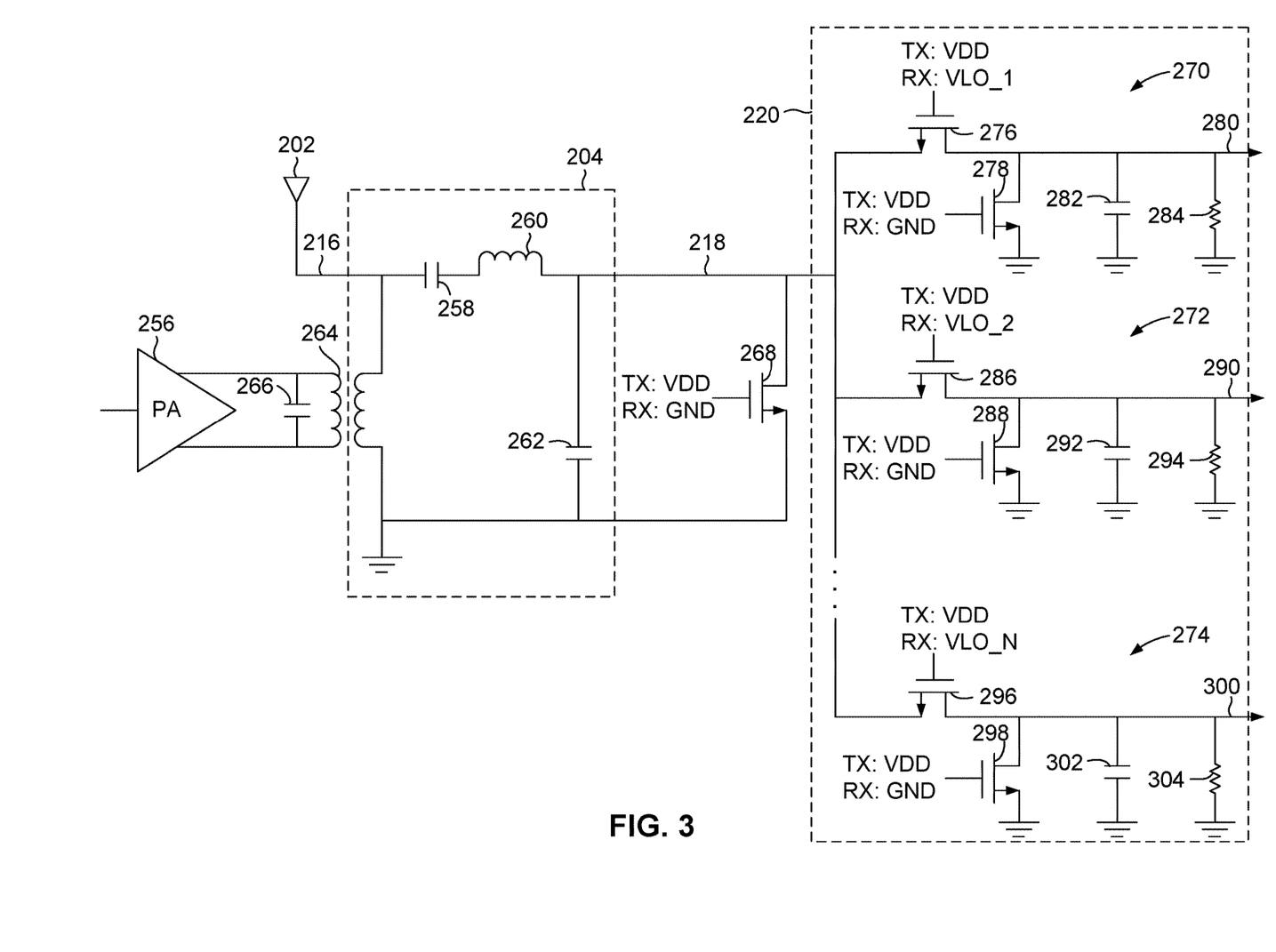
FIG. 3 is a schematic circuit diagram including a receiver portion of the wireless transceiver device of FIG. 2, in accordance with various aspects of the present disclosure.

FIG. 3 illustrates an example of portions of wireless device 200 (FIG. 2). These portions include passive gain front end 204 and N-path filter 220.

Passive gain front end 204 may include a capacitor 258 and an inductor 260 in series with each other. Capacitor 258 and inductor 260 are coupled between antenna connection 216 and received signal connection 218. Passive gain front end 204 further includes another capacitor 262 coupled between received signal connection 218 and ground. A transformer 264, the secondary side of which may be conceptually part of passive gain front end 204, and the primary side of which may be conceptually part of transmitter portion 210, couples power amplifier 256 to passive gain front end 204. The secondary side of transformer 264 is connected between antenna connection 216 and ground. A capacitor 266 may be included across the differential outputs of power amplifier 256, which are connected across the primary side of transformer 264.

A transistor 268 may be coupled between received signal connection 218 and ground to serve as a TX/RX switch. In the illustrated example, the drain and source terminals of transistor 268 are coupled to received signal connection 218 and ground, respectively, while the gate terminal is coupled to TX/RX mode control signal 214. In the example illustrated in FIG. 3, a TX/RX mode control signal 214 voltage of zero may indicate the receive mode, while a TX/RX mode control signal 214 voltage of VDD (a supply voltage) may indicate the transmit mode. Nevertheless, in other examples (not shown) a controller or other intermediary device may control transistor 268 or other TX/RX switch in response to a TX/RX mode indicating signal. For example, the controller may derive a control signal for transistor 268 (and/or other elements of the passive gain front end 204 and/or N-path filter 220) based on the TX/RX mode indicating signal 214. In the example illustrated in FIG. 3, transistor 268 may turn off in response to TX/RX mode control signal 214 indicating the receive mode and turn on in response to TX/RX mode control signal 214 indicating the transmit mode. When transistor 268 is off, passive gain front end 204 is able to apply passive gain to the signal received at antenna connection 216. Thus, the received signal that passive gain front end 204 provides to N-path filter 220 on received signal connection 218 reflects an amplitude gain over the antenna signal. When transistor 268 is on, passive gain front end 204 is not able to provide passive gain because transistor 268 shorts received signal connection 218 to ground. Although transistor 268 serves as a TX/RX switch in the illustrated embodiment, in other embodiments (not shown) such a TX/RX switch may be omitted because N-path filter 220 may provide a similar effect.

N-path filter 220 includes a first path 270, a second path 272, etc., through an Nth path 274 (there may be additional paths between second path 272 and Nth path 274 that are not shown for purposes of clarity, which paths are indicated by an ellipsis (" . . . ") symbol). Each of the N paths 270 through 274 has the same structure. The exemplary path structure is described below. The output of each path may be coupled to a respective amplifier 224a-224n (FIG. 2).

First path 270 includes a transistor 276 configured as a mixer switch and a transistor 278 configured as an isolation switch. In the illustrated example, the source terminal of transistor 276 is connected to received signal connection 218, and the drain terminal of transistor 276 is connected to a first path output connection 280. First path 270 further includes a capacitor 282 connected between first path output connection 280 and ground, and a resistor 284 connected between first path output connection 280 and ground.

The gate terminal of transistor 278 is coupled to TX/RX mode control signal 214 or a derivative thereof. Thus, transistor 278 may turn off in response to TX/RX mode control signal 214 indicating the receive mode and turn on in response to TX/RX mode control signal 214 indicating the transmit mode. The drain terminal of transistor 278 is connected to first path output connection 280, and the source terminal of transistor 278 is connected to ground. Thus, the source terminals of transistors 276 and 278 may be connected to a common node that is further connected to the output connection (280). When transistor 278 is off, N-path filter 220 may provide the N-path filter and mixer function that is understood by one of ordinary skill in the art. To provide this function, RX LO signal generator 222 (FIG. 2) may apply a first LO signal, VLO_1, to the gate of transistor 276. The RX LO signal generator 222 applies VLO_1 to the gate of transistor 276 in response to TX/RX mode control signal 214 indicating the receive mode, but applies VDD to the gate of transistor 276 in response to TX/RX mode control signal 214 indicating the transmit mode. Thus, in transmit mode, when transistors 276 and 278 are both on, N-path filter 220 is prevented from providing the N-path filter and mixer function because transistors 276 and 278 short first path output connection 280 to ground.

Second path 272 similarly includes a transistor 286 configured as a mixer switch and a transistor 288 configured as an isolation switch. In the illustrated example, the source terminal of transistor 286 is connected to received signal connection 218, and the drain terminal of transistor 286 is connected to a second path output connection 290. Second path 272 further includes a capacitor 292 connected between second path output connection 290 and ground, and a resistor 294 connected between second path output connection 290 and ground.

The gate terminal of transistor 288 is coupled to TX/RX mode control signal 214 or a derivative thereof. Thus, transistor 288 may turn off in response to TX/RX mode control signal 214 indicating the receive mode and turn on in response to TX/RX mode control signal 214 indicating the transmit mode. The drain terminal of transistor 288 is connected to second path output connection 290, and the source terminal of transistor 288 is connected to ground. When transistor 288 is off, N-path filter 220 may provide the N-path filter and mixer function. To provide this function, RX LO signal generator 222 (FIG. 2) may apply a second LO signal, VLO_2, to the gate of transistor 286. The RX LO signal generator 222 applies VLO_2 to the gate of transistor 286 in response to TX/RX mode control signal 214 indicating the receive mode, but applies VDD to the gate of transistor 286 in response to TX/RX mode control signal 214 indicating the transmit mode. Thus, in transmit mode, when transistors 286 and 288 are both on, N-path filter 220 is prevented from providing the N-path filter and mixer function because transistors 286 and 288 short second path output connection 290 to ground.

The remaining paths have the same structure and function as described above with regard to first and second paths 270 and 272. Thus, Nth path 274 includes a transistor 296 configured as a mixer switch and a transistor 298 configured as an isolation switch. The source terminal of transistor 296 is connected to received signal connection 218, and the drain terminal of transistor 296 is connected to an Nth path output connection 300. The Nth path 274 further includes a capacitor 302 connected between Nth path output connection 300 and ground, and a resistor 304 connected between Nth path output connection 300 and ground.

The gate terminal of transistor 298 is coupled to TX/RX mode control signal 214 or a derivative thereof. Thus, transistor 298 may turn off in response to TX/RX mode control signal 214 indicating the receive mode and turn on in response to TX/RX mode control signal 214 indicating the transmit mode. The drain terminal of transistor 298 is connected to Nth path output connection 300, and the source terminal of transistor 298 is connected to ground. When transistor 298 is off, N-path filter 220 may provide the N-path filter and mixer function. To provide this function, RX LO signal generator 222 (FIG. 2) may apply an Nth LO signal, VLO_N, to the gate of transistor 296. The RX LO signal generator 222 applies VLO_N to the gate of transistor 296 in response to TX/RX mode control signal 214 indicating the receive mode, but applies VDD to the gate of transistor 296 in response to TX/RX mode control signal 214 indicating the transmit mode. Thus, in transmit mode, when transistors 296 and 298 are both on, N-path filter 220 is prevented from providing the N-path filter and mixer function because transistors 296 and 298 short Nth path output connection 300 to ground. It should be understood that although the various transistors described above are illustrated as having an NMOS structure, one of ordinary skill in the art understands that equivalent circuitry may be provided using PMOS or other transistors.

Figure 4:
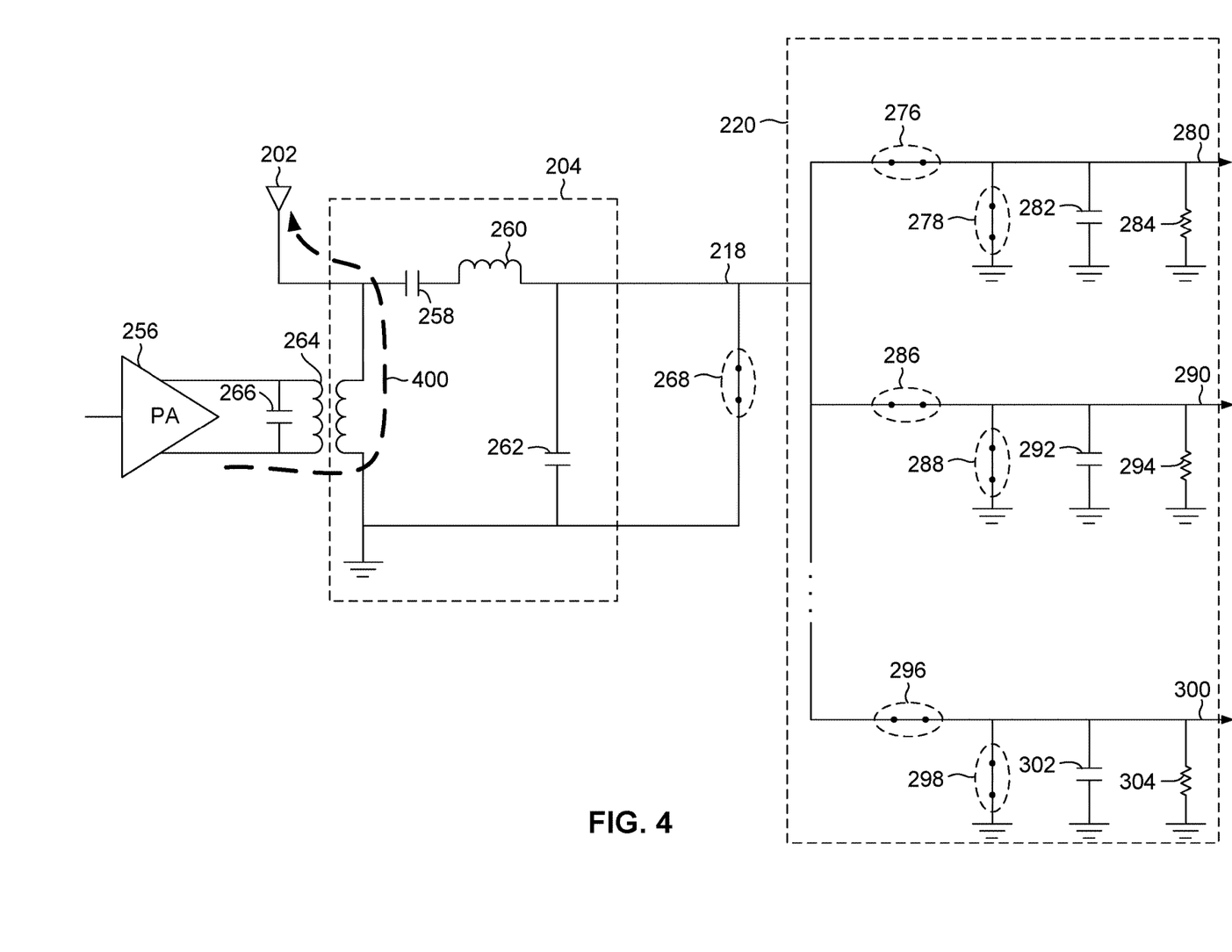
FIG. 4 is similar to FIG. 3, illustrating operation in a transmit mode, in accordance with various aspects of the present disclosure.

FIG. 4 illustrates operation of the above-described circuitry (FIG. 3) in the transmit mode. In the transmit mode, the output of power amplifier 256 is coupled in a path 400

(indicated in broken-line) through transformer 264 to antenna 202. In FIG. 4, the "on" transistors 268, 276, 278, 286, 288, 296, and 298 are conceptually depicted in the form of closed switches, as they would be in response to TX/RX mode control signal 214 indicating the transmit mode. When all of transistors 276, 286, etc., through 296 are on, they may provide the same effect as transistor 268 to reduce loading at antenna 202. Passive gain front end 204 may also provide attenuation to receiver portion 212 (FIG. 2) in transmit mode, thereby providing isolation or protection for the N mixer switches (i.e., transistors 276, 286, etc., through 296). In this manner passive gain front end 204 may also help reduce losses in transmit mode.

Figure 5:
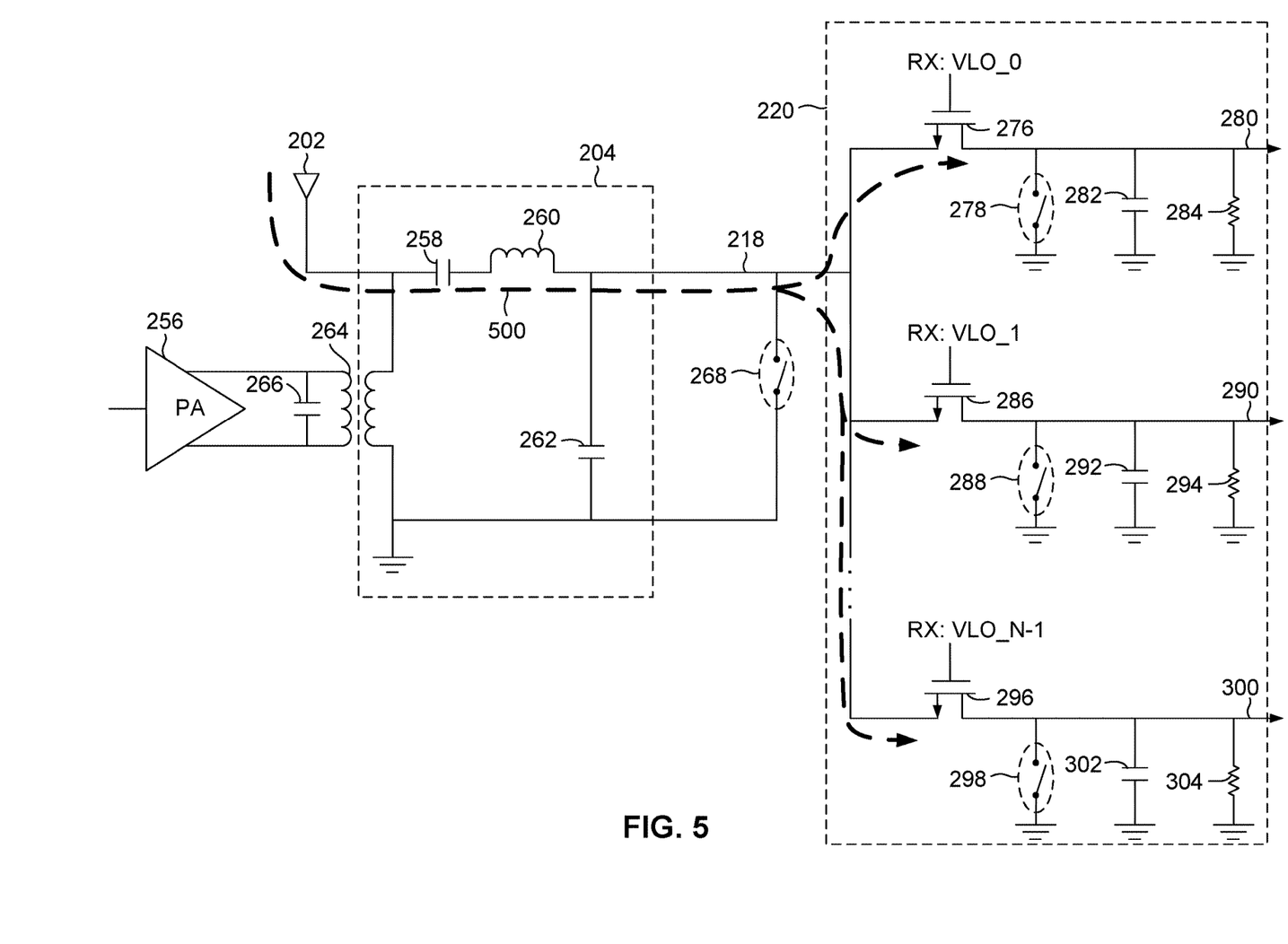
FIG. 5 is similar to FIG. 3, illustrating operation in a receive mode, in accordance with various aspects of the present disclosure.

FIG. 5 illustrates operation of the above-described circuitry (FIG. 3) in the receive mode. In FIG. 5, the "off" transistors 268, 278, 288, and 298 are conceptually depicted in the form of open switches, as they would be in response to TX/RX mode control signal 214 indicating the receive mode. In the receive mode, the signal received at antenna 202 is coupled in a path 500 through capacitor 258 and inductor 260 of passive gain front end 204 to the input (received signal connection 218) of N-path filter 220, thereby passively providing gain (i.e., without employing an amplifier). As transistor 268 is off, passive gain front end 204 is not prevented from providing gain in this manner. Passive gain is implemented by the resonating network, comprising transformer 264, inductor 260, and capacitor 262. The passive gain is due to the impedance transformation, which stems from the inductance ratio between inductor 260 and the secondary side of transformer 264, and from the inductor 260 and capacitor 262 resonance. In the receive mode, the N mixer switches (i.e., transistors 276, 286, etc., through 296) operate in response to the RX LO signals VLO_1, VLO2, etc., through VLO_N, respectively, to downconvert the received signal.

Figure 6:
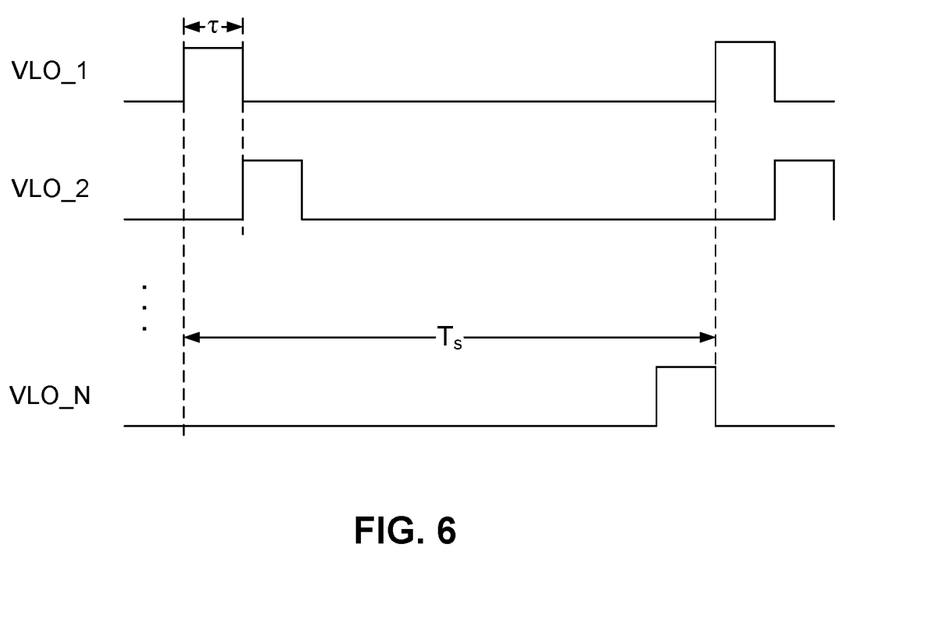
FIG. 6 illustrates a sequence of receiver local oscillator signals.

FIG. 6 illustrates an example of a sequence of RX LO signals VLO_1, VLO2, etc., through VLO_N. To achieve the effects that are characteristic of an N-path filter configured as a downconversion mixer, the sequence of signals is applied to the N mixer switches in a cyclical manner, as understood by one of ordinary skill in the art. The duty cycle (D) of the RX LO clock defines the number N of RX LO signals: $N=1/D$. As depicted in FIG. 6, $D=\tau/T_S$, where $\tau$ is the RX LO signal (pulse) width, and $T_S$ is the cycle length. For example, for a 25 percent duty cycle, $N=4$.

Figure 7:
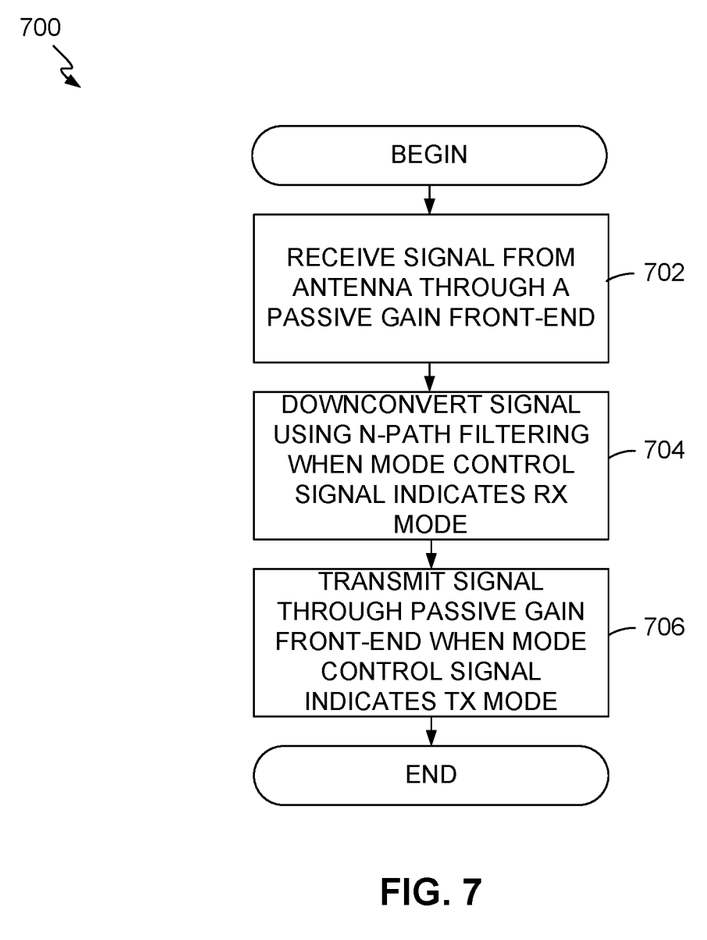
FIG. 7 is a flow diagram illustrating an example of a method for wireless communication, in accordance with various aspects of the present disclosure.

FIG. 7 is a flow chart illustrating an exemplary method 700 for wireless communication, in accordance with various aspects of the present disclosure. The steps or acts in method 700 may occur in the order indicated by the corresponding blocks in FIG. 7, or may occur in any other order not logically inconsistent with the descriptions herein, such as, for example, at least partly in parallel. In related exemplary methods, some of the steps or acts indicated by the blocks in FIG. 7 may be omitted, or additional steps or acts may be included. Also, method 700 may be included as part of another method or combined with another method.

As indicated by block 702, method 700 may include receiving a signal from an antenna through a passive gain front end circuit. Accordingly, a passive gain is applied to the received signal. The application of passive gain to the received signal may be responsive to a TX/RX mode control signal indicating a receive mode. As indicated by block 704, method 700 may include downconverting the signal that is provided through the passive gain front end circuit, in response to the TX/RX mode control signal indicating the receive mode. Downconverting may include using an N-path filter or mixer. As indicated by block 706, method 700 may still further include transmitting a signal through the passive gain front end circuit when the TX/RX mode control signal indicates a transmit mode.

Figure 8:
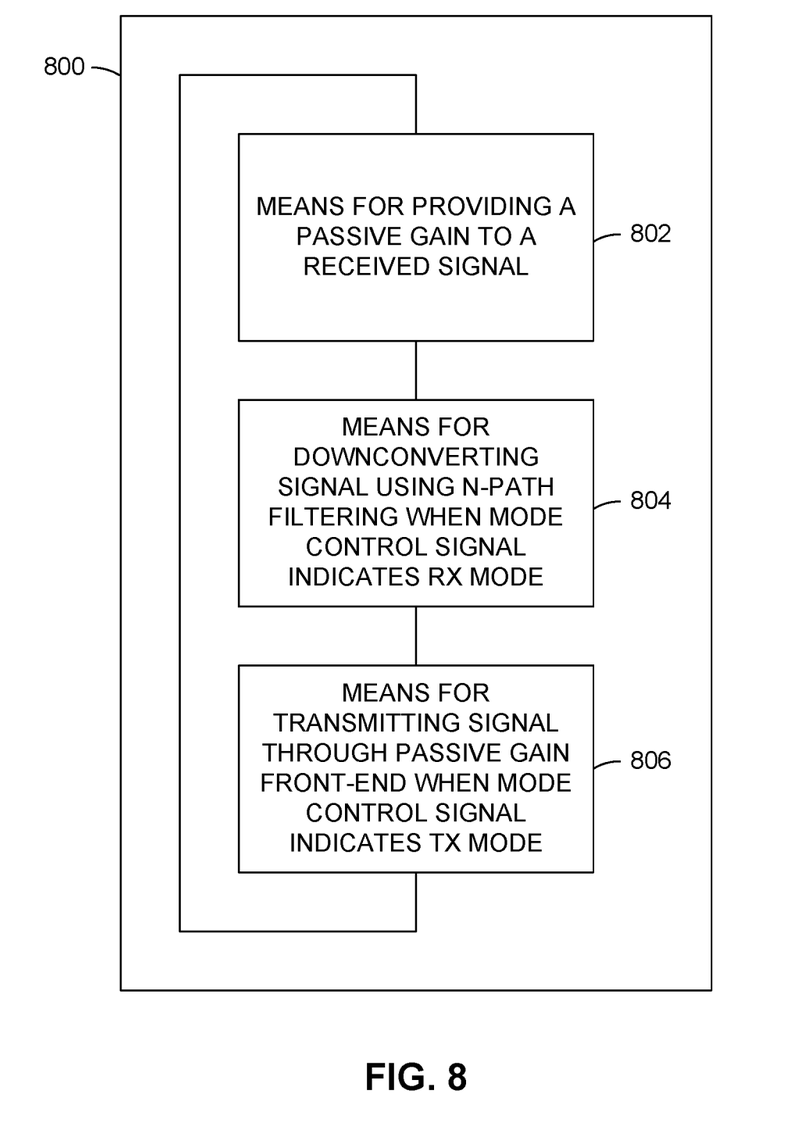
FIG. 8 is a functional block diagram illustrating an apparatus for wireless communication, in accordance with various aspects of the present disclosure.

FIG. 8 is a functional block diagram illustrating an apparatus 800 for wireless communication, in accordance with various aspects of the present disclosure. Apparatus 800 may comprise means 802 for providing a passive gain to a received signal. In certain embodiments, means 802 may be configured to perform one or more of the functions described above with regard to block 702 (FIG. 7). Means 802 may comprise, for example, passive gain front end 204 (FIG. 2). Apparatus 800 may also comprise means 804 for downconverting the received signal provided through the passive gain front end circuit. In certain embodiments, means 804 may be configured to perform one or more of the functions described above with regard to block 704 (FIG. 7). Means 804 may comprise, for example, N-path filter 220. Apparatus 800 may still further comprise means 806 for transmitting a signal through a passive gain front end. In certain embodiments, means 806 may be configured to perform one or more of the functions described above with regard to block 706 (FIG. 7). Means 806 may comprise, for example, a transformer 264 or portion thereof and/or a switch 268 and/or 278, 288, 298. Means 806 may further comprise, for example, power amplifier 256.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

The detailed description set forth above in connection with the appended drawings describes examples and does not represent the only examples that may be implemented or that are within the scope of the claims. The terms "example" and "exemplary," when used in this description, mean "serving as an example, instance, or illustration," and do not mean "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Non-transitory computer-readable media include both computer storage media and communication media including any non-transitory medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. "Disk" and "disc," as used may be herein, include compact disc (CD), laser disc, optical disc, digital versatile disc (DVD), floppy disk, and Blu-ray disc, where disks usually reproduce data magnetically, while discs reproduce data optically with lasers. Combinations of the above are also included within the scope of non-transitory computer-readable media.

The foregoing is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

Therefore, although selected aspects have been illustrated and described in detail, it will be understood that various substitutions and alterations may be made therein without departing from the spirit and scope of the present invention, as defined by the following claims.

What is claimed is:

1. A system for wireless communication, comprising:
   a passive gain front end circuit having an antenna connection and a signal connection;
   a receiver circuit having an N-path filter coupled to the signal connection of the passive gain front end circuit; and
   a transmitter circuit connected to the passive gain front end circuit independent from the signal connection and the antenna connection;
   wherein the N-path filter is configured to downconvert a received radio frequency signal using a sequence of N local oscillator signals in response to a TX/RX mode control signal indicating a receive mode.

2. The system of claim 1, wherein the N-path filter is directly connected to the signal connection of the passive gain front end circuit without a low-noise amplifier between the N-path filter and the passive gain front end circuit.

3. The system of claim 1, wherein:
   the transmitter circuit includes a power amplifier; and
   the passive gain front end circuit includes a transformer configured to couple an output of the power amplifier to the antenna connection.

4. The system of claim 1, wherein the passive gain front end circuit is configured to connect the N-path filter to the antenna connection and provide passive gain in response to a TX/RX mode control signal indicating a receive mode.

5. The system of claim 4, further comprising a transmit/receive (TX/RX) switch configured to short an output of the passive gain front end circuit to ground in response to the TX/RX mode control signal indicating a transmit mode.

6. The system of claim 1, wherein the N-path filter is configured to short an output of each of N paths of the N-path filter to ground in response to the TX/RX mode control signal indicating a transmit mode.

7. A method for wireless communication, comprising:
   receiving a receive signal from an antenna through a passive gain front end circuit;
   providing passive gain to the receive signal by the passive gain front end circuit in response to a TX/RX mode control signal indicating a receive mode;
   passing the receive signal to an N-path filter from the passive gain front end circuit in response to the TX/RX mode control signal indicating the receive mode;

downconverting the receive signal using the N-path filter in the receive mode; and transmitting a transmit signal through the passive gain front end circuit in a transmit mode.

8. The method of claim 7, wherein transmitting the transmit signal comprises coupling the signal from a power amplifier through a transformer of the passive gain front end circuit.

9. The method of claim 8, wherein receiving the receive signal comprises providing the receive signal from the passive gain front end circuit to the N-path filter without providing the receive signal to a low-noise amplifier.

10. The method of claim 7, further comprising shorting an output of the passive gain front end circuit to ground in response to the TX/RX mode control signal indicating the transmit mode.

11. The method of claim 7, further comprising shorting an output of each of N paths of the N-path filter to ground in response to the TX/RX mode control signal indicating the transmit mode.

12. An apparatus for wireless communication, comprising:

means for providing a passive gain to a signal received wirelessly;

means for downconverting the received signal using N-path filtering in a receive mode, the means for downconverting coupled to the means for providing a passive gain; and means for transmitting a transmit signal in a transmit mode, the means for transmitting being coupled to the means for providing a passive gain, wherein the means for transmitting comprises means for coupling the signal from a power amplifier through a transformer of a passive gain front end circuit.

13. The apparatus of claim 12, wherein the means for providing a passive gain to a received signal comprises a passive gain front end circuit, wherein the received signal is coupled to an N-path filter without providing the received signal to a low-noise amplifier.

14. The apparatus of claim 12, wherein the means for providing a passive gain to a received signal comprises:

means for coupling an N-path filter to an antenna through a passive gain front end circuit in response to a TX/RX mode control signal indicating the receive mode;

wherein the passive gain is provided to the receive signal by the passive gain front end circuit in response to the TX/RX mode control signal indicating the receive mode.

15. The apparatus of claim 14, further comprising means for shorting an output of the passive gain front end circuit to ground in response to the TX/RX mode control signal indicating the transmit mode.

16. The apparatus of claim 14, further comprising means for shorting an output of each of N paths of the N-path filter to ground in response to the TX/RX mode control signal indicating the transmit mode.

17. The apparatus of claim 14, wherein:

the means for transmitting includes a power amplifier; and the means for providing a passive gain includes a transformer configured to couple an output of the power amplifier to the antenna.

18. A system for wireless communication, comprising:

a passive gain front end circuit having an antenna connection and a signal connection; and a receiver circuit having an N-path filter coupled to the signal connection of the passive gain front end circuit, wherein the N-path filter is directly connected to the signal connection of the passive gain front end circuit without a low-noise amplifier between the N-path filter and the passive gain front end circuit.

* * * * *